United States Patent
Bakran

(10) Patent No.: US 9,829,534 B2
(45) Date of Patent: Nov. 28, 2017

(54) DEVICE AND METHOD FOR MONITORING A POWER SEMICONDUCTOR SWITCH

(71) Applicant: Siemens Aktiengesellschaft, München (DE)

(72) Inventor: Mark-Matthias Bakran, Erlangen (DE)

(73) Assignee: Siemens Aktiengesellschaft, München (DE)

( * ) Notice: Subject to any disclaimer, the term of this patent is extended or adjusted under 35 U.S.C. 154(b) by 0 days.

(21) Appl. No.: 14/897,160

(22) PCT Filed: May 7, 2014

(86) PCT No.: PCT/EP2014/059283
§ 371 (c)(1),
(2) Date: Dec. 9, 2015

(87) PCT Pub. No.: WO2014/202274
PCT Pub. Date: Dec. 24, 2014

(65) Prior Publication Data
US 2016/0124040 A1  May 5, 2016

(30) Foreign Application Priority Data

Jun. 18, 2013 (DE) ......................... 10 2013 211 411

(51) Int. Cl.
*G01R 31/27* (2006.01)
*H03K 17/18* (2006.01)
*G01R 31/327* (2006.01)

(52) U.S. Cl.
CPC ......... *G01R 31/27* (2013.01); *G01R 31/3275* (2013.01); *H03K 17/18* (2013.01)

(58) Field of Classification Search
CPC ..... G01R 31/27; G01R 31/3275; H03K 17/18
See application file for complete search history.

(56) References Cited

U.S. PATENT DOCUMENTS 6,337,804 B1 * 1/2002 Kea .................. H02M 7/487
363/132
6,405,154 B1  6/2002 Ryan
(Continued)

FOREIGN PATENT DOCUMENTS

CN 101754510 A 6/2010
CN 102301252 A 12/2011
(Continued)

*Primary Examiner* — John Breene
*Assistant Examiner* — Eyob Hagos
(74) *Attorney, Agent, or Firm* — Henry M. Feiereisen LLC

(57) ABSTRACT

A device for monitoring a power semiconductor switch includes a circuit section for applying to the power semiconductor switch an HF voltage having a frequency above a switching threshold of the power semiconductor switch, a shunt resistor for detecting an actual HF current resulting from application of the HF voltage to the power semiconductor switch, a monitoring circuit for comparing the actual HF current with an expected HF current that depends on a switching state of the power semiconductor switch when the HF voltage is applied to the power semiconductor switch, and a comparator for generating a power semiconductor status signal depending on a result of the comparison. A corresponding method for monitoring a power semiconductor switch of this type is also described.

7 Claims, 4 Drawing Sheets

(56) References Cited

U.S. PATENT DOCUMENTS

| | | | |
|---|---|---|---|
| 6,477,694 B1* | 11/2002 | Irino | G06F 17/5068 |
| | | | 257/208 |
| 7,480,160 B2 | 1/2009 | Bakran et al. | |
| 7,582,939 B2 | 9/2009 | Bakran et al. | |
| 8,188,807 B2 | 5/2012 | Bakran et al. | |
| 2006/0107241 A1 | 5/2006 | Tanabe | |
| 2008/0060542 A1 | 3/2008 | Bakran et al. | |
| 2009/0085542 A1* | 4/2009 | Numano | H03K 17/785 |
| | | | 323/282 |
| 2010/0264865 A1 | 10/2010 | Bakran | |
| 2011/0278918 A1 | 11/2011 | Shindo | |
| 2011/0291672 A1* | 12/2011 | Huttinger | G01R 31/27 |
| | | | 324/649 |
| 2013/0270974 A1* | 10/2013 | Wang | B60L 3/0069 |
| | | | 310/68 R |

FOREIGN PATENT DOCUMENTS

| | | |
|---|---|---|
| DE | 102005045957 A1 | 11/2006 |
| DE | 10 2007 026 784 A1 | 12/2008 |
| DE | 102009006970 A1 | 8/2010 |
| DE | 102011105112 A1 | 12/2012 |
| EP | 1 083 658 A1 | 3/2001 |
| EP | 1096839 A2 | 5/2001 |
| RU | 2310878 C1 | 11/2007 |
| SU | 1075201 A1 | 2/1984 |
| WO | WO 2010145692 A1 | 12/2010 |

\* cited by examiner

DEVICE AND METHOD FOR MONITORING A POWER SEMICONDUCTOR SWITCH

CROSS-REFERENCES TO RELATED APPLICATIONS

This application is the U.S. National Stage of International Application No. PCT/EP2014/059283, filed May 7, 2014, which designated the United States and has been published as International Publication No. WO 2014/202274 and which claims the priority of German Patent Application, Serial No. 10 2013 211 411.7, filed Jun. 18, 2013, pursuant to 35 U.S.C. 119(a)-(d).

BACKGROUND OF THE INVENTION

The invention relates to a device and method for monitoring a power semiconductor switch to ensure the functional safety of the respective power semiconductor.

The invention addresses the problem that, for an item of equipment incorporating a switching element, a means of testing whether the switching element is available must exist if the equipment is to meet a heightened safety level. The same applies if a power semiconductor switch is to be used as the switching element. Accordingly, in the case of an item of equipment having a power semiconductor switch as the switching element, e.g. a power converter, it is necessary to be able to test the operation of the power semiconductor switch regularly in order to ensure that it is available.

There is currently no known device and method for such monitoring of a power semiconductor switch. Hitherto, mechanical relays have mainly been used for safety-relevant tasks. An additional mechanical contact unit in such a relay enables the relay to be monitored for correct operation. If power semiconductor switches are used for safety functions, it has hitherto only been possible to provide monitoring of the power semiconductor switch for operability by means of "trial operation". However, this involves the power circuit containing the power semiconductor switch and is therefore somewhat undesirable.

SUMMARY OF THE INVENTION

The object of the invention is to therefore to specify a device and a method for monitoring a power semiconductor switch, said method and device not involving the power circuit of the power semiconductor switch.

According to one aspect of the invention, a device for monitoring a power semiconductor switch includes the following functional units: first, means of applying a high-frequency voltage (HF voltage; $U_{HF}$) to the power semiconductor switch at a frequency above the switching threshold of the power semiconductor switch in addition to triggering the power semiconductor switch by means of an external triggering signal, wherein the external triggering signal produces a switching state of the power semiconductor switch corresponding to the triggering signal. Then, means of detecting an HF current ($I_{HF,actual}$) resulting from the application of the HF voltage ($U_{HF}$) to the power semiconductor switch. In addition, means of comparing the resulting HF current ($I_{HF,actual}$) with an HF current ($I_{HF,nom}$) which is expected according to the switching state of the power semiconductor switch as a result of the application of the HF voltage ($U_{HF}$) to the power semiconductor switch. Lastly, means of generating a power semiconductor status signal depending on the result of the comparison.

According to another aspect of the invention, a method for monitoring a power semiconductor switch includes at least the following steps: the power semiconductor switch has applied to it a high-frequency voltage (HF voltage; $U_{HF}$) having a frequency above a switching threshold of the power semiconductor switch, in addition to being triggered by means of an external triggering signal. The external triggering signal produces a switching state of the power semiconductor switch corresponding to the triggering signal. An HF current ($I_{HF,actual}$) resulting from the application of the HF voltage ($U_{HF}$) to the power semiconductor switch is detected. The resulting HF current ($I_{HF,actual}$) is compared with an HF current ($I_{HF,nom}$) which is expected according to the switching state of the power semiconductor switch as a result of the application of the HF voltage ($U_{HF}$) to the power semiconductor switch. A power semiconductor status signal is generated depending on the result of this comparison.

The advantage of the invention is that the approach presented here specifies a device and a method for testing the operability of the power semiconductor switch by the triggering thereof, without involving the actual power circuit.

BRIEF DESCRIPTION OF THE DRAWING

An exemplary embodiment of the invention will now be explained in greater detail. Corresponding items or elements are provided with the same reference characters in all the accompanying drawings, in which.

DETAILED DESCRIPTION OF PREFERRED EMBODIMENTS

Figure 1:
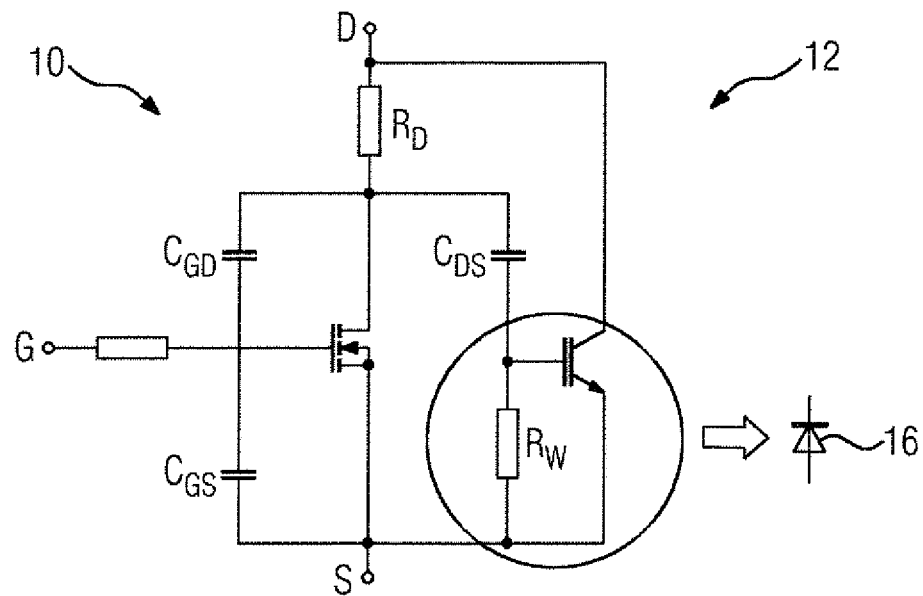
FIG. 1 shows an equivalent circuit diagram of a power semiconductor switch in the form of a MOSFET.
Figure 2:
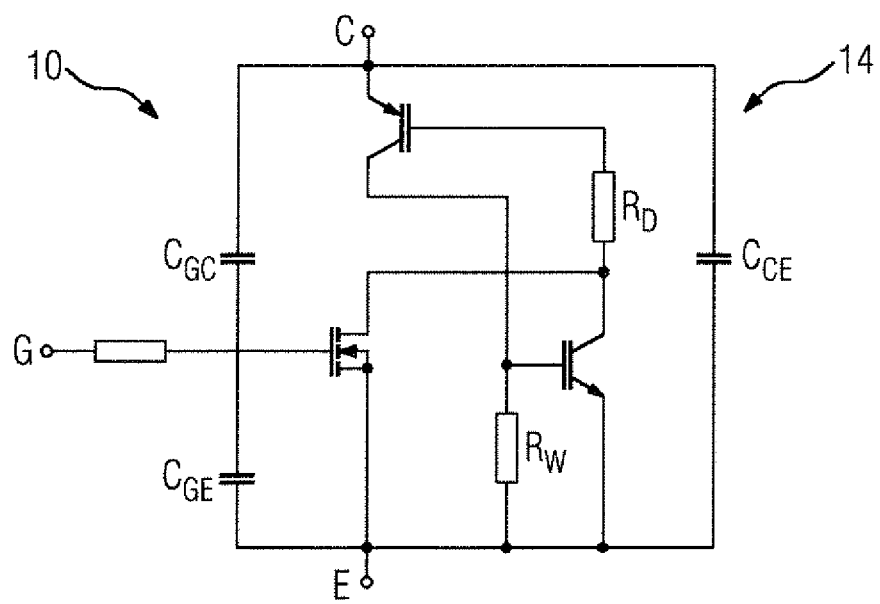
FIG. 2 shows an equivalent circuit diagram of a power semiconductor switch in the form of an IGBT.

The representations in FIG. 1 and FIG. 2 show equivalent circuit diagrams of power semiconductor switches (power semiconductors) 10 that may currently be used for safety functions. The representation in FIG. 1 shows the equivalent circuit diagram of a MOSFET 12 and the representation in FIG. 2 shows the equivalent circuit diagram of an IGBT 14.

For both power semiconductor switches 10, the usual terminals are shown and denoted by the customary terminology in each case. Accordingly, a power semiconductor switch 10 in the form of a MOSFET 12 has a gate terminal (G), a source terminal (S) and a drain terminal (D). Correspondingly, a power semiconductor switch 10 in the form of an IGBT 14 has a gate terminal (G), a collector terminal (C) and an emitter terminal (E).

Marked between two of these terminals of a power semiconductor switch 10 in the equivalent circuit diagrams in each case is the capacitance resulting from the device characteristics, namely for a MOSFET 12 in the form of a capacitor having the capacitance $C_{GS}$ between the gate terminal (G) and the source terminal (S), of a capacitor having the capacitance $C_{GD}$ between the gate terminal (G) and the drain terminal (D), and a capacitor having the capacitance $C_{DS}$ between the drain terminal (D) and the source terminal (S). This applies correspondingly to the equivalent circuit diagram of the IGBT 14. Accordingly, this shows a capacitor having the capacitance $C_{GE}$ between the gate terminal (G) and the emitter terminal (E), a capacitor having the capacitance $C_{GC}$ between the gate terminal (G) and the collector terminal (C), and a capacitor having the capacitance $C_{CE}$ between the collector terminal (C) and the emitter terminal (E).

In FIG. 1, for the representation of the equivalent circuit diagram shown there of a power semiconductor switch 10 in the form of a MOSFET 12, the equivalent circuit diagram of an inverse diode 16 incorporated in such a power semiconductor switch 10 is also shown.

For the case that a power semiconductor switch 10, in particular a power semiconductor switch 10 in the form of a MOSFET 12 or in the form of an IGBT 14, is defective, this is reflected in a changed capacitive behavior. Defectiveness of the power semiconductor switch 10 is to be understood as meaning partial destruction of the respective component, but also loss of at least one contact. Destruction of cell regions of a power semiconductor switch 10 results, for example, in a reduction in the input capacitance, i.e. the gate capacitance $C_{GS}$ in the case of the MOSFET 12 or gate capacitance $C_{GE}$ in the case of the IGBT 14. Even relatively minor defects can be detected in this way.

Figure 3:
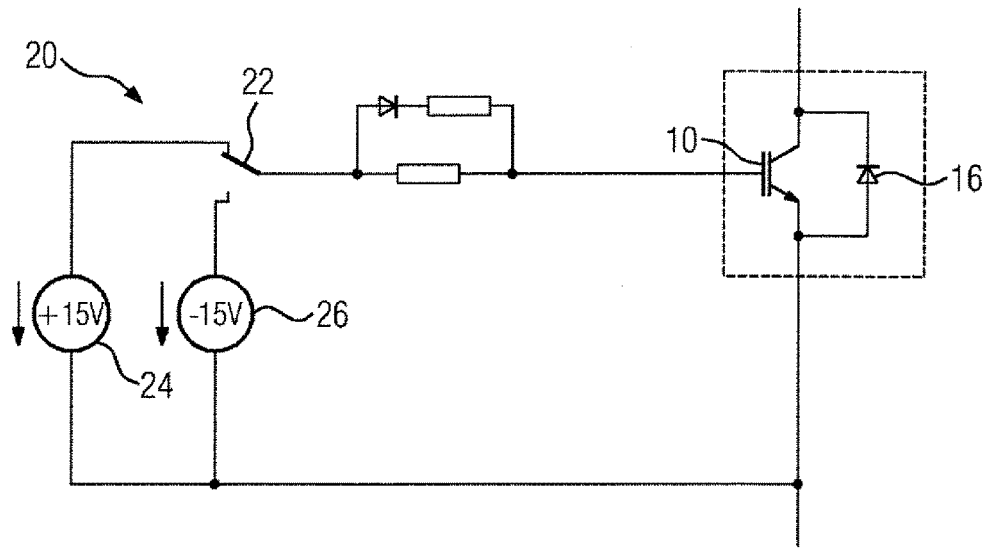
FIG. 3 shows a control circuit for triggering a power semiconductor switch.
Figure 4:
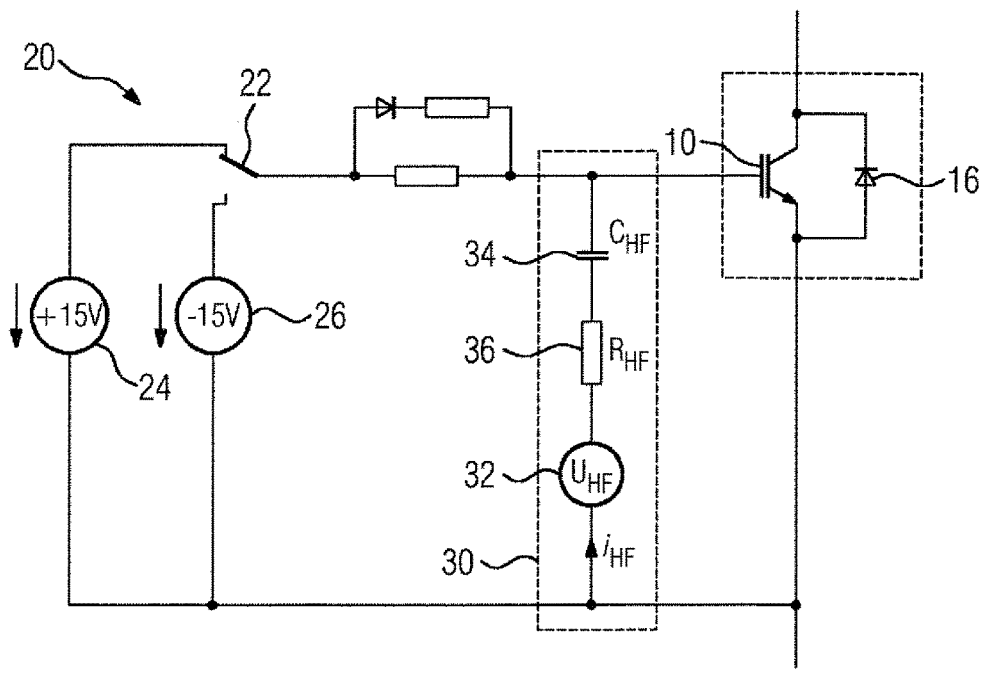
FIG. 4 shows a control circuit according to FIG. 3 having a circuit section for triggering the power semiconductor switch to test the operability thereof.

The representations in FIG. 3 and FIG. 4 show control circuits 20 for triggering a power semiconductor switch 10. The power semiconductor switch 10 is shown together with a parallel-connected reverse diode 16, as is the case, for example, in an input power converter or an output power converter of an AC/AC converter.

Depending on the setting of the switch 22 incorporated in the control circuit 20, the power semiconductor switch 10 has applied to it, i.e. is triggered by, a positive or a negative control potential, here in the form of a first voltage source 24 supplying +15 V, for example, and a second voltage source 26 supplying −15 V, for example.

The control circuit 20 shown in FIG. 3 corresponds to a control circuit 20 as is known in the prior art. In comparison to the control circuit 20 in FIG. 3, the control circuit 20 shown in FIG. 4 comprises an additional circuit section 30 which injects a high-frequency voltage (HF voltage; $U_{HF}$) into the gate circuit of the respective power semiconductor switch 10. The circuit section 30 is accordingly an example of means 30 of applying to the power semiconductor switch. 10 an HF voltage ($U_{HF}$) having a frequency above a switching threshold of the power semiconductor switch 10. Said HF voltage is applied simultaneously with triggering of the power semiconductor switch 10 as a result of a respective setting of the switch 22 or of a corresponding signal source.

As the basis for the high-frequency voltage ($U_{HF}$), an HF voltage source 32 is shown here. This is decoupled from the gate terminal of the respective power semiconductor switch 10 with respect to high-frequencies by means of a decoupling capacitor 34 of capacitance CHF connected in series with the HF voltage source 32 within the circuit section 30. A current ($I_{HF}$), hereinafter referred to as the HF current, resulting from the high-frequency voltage ($U_{HF}$) is detected by means of a shunt resistor ($R_{HF}$) 36. However, instead of using a shunt resistor 36, the HF current ($I_{HF}$) can equally be detected inductively, for example. The shunt resistor ($R_{HF}$) 36 or inductive detection of the HF current ($I_{HF}$) are accordingly examples of means of detecting the HF current ($I_{HF,actual}$) resulting from the application of the HF voltage ($U_{HF}$) to the power semiconductor switch (10).

The frequency and amplitude of the high-frequency voltage ($U_{HF}$) are selected such that the frequency far exceeds the switching frequency of the power semiconductor switch 10. A possible frequency is accordingly a frequency higher than 10 MHz, for example. For the amplitude of the high-frequency voltage ($U_{HF}$) it is provided that this is well below the normal voltage values used to trigger a power semiconductor switch 10. A possible amplitude is accordingly an amplitude of about 1 V.

Figure 5:
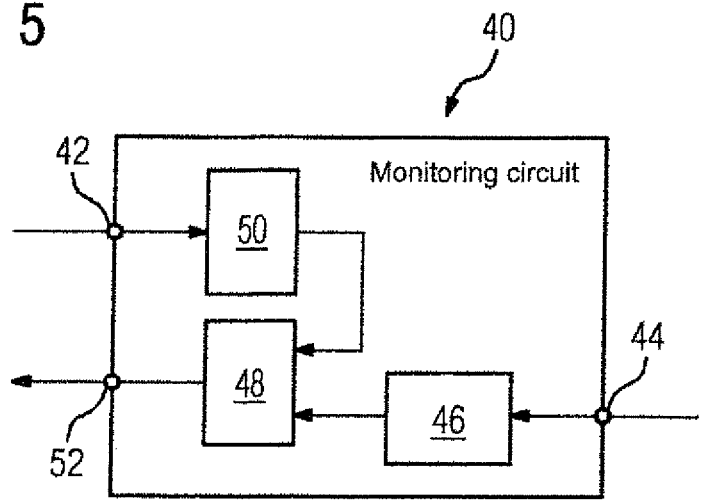
FIG. 5 shows a monitoring circuit for analyzing the triggering of the power semiconductor switch by the circuit section in FIG. 4.

To monitor the respective power semiconductor switch 10, the control circuit 20 is assigned a monitoring circuit 40. This is shown in schematically simplified form in FIG. 5. The switching state of the switch 22 of the control circuit 20 is fed to the monitoring circuit 40 at a first input 42. The current ($I_{HF}$) resulting from the high-frequency voltage ($U_{HF}$) is fed directly or indirectly to the monitoring circuit 40 at a second input 44, e.g. in the form of a measure for the voltage that can be tapped off across the shunt resistor 36.

If a measure for the voltage that can be tapped off across shunt resistor 36 is fed to the monitoring circuit 40, this measure and the known resistance value of the shunt resistor 36 are used to determine a current ($I_{HF,actual}$) actually resulting from the high-frequency voltage ($U_{HF}$). For this purpose the monitoring circuit 40 comprises an actual HF current value determining device 46. The functionality of the actual HF current value determining device 46 consists, for example, of forming the quotient of the measure fed to the second input 44 for the voltage that can be tapped off across the shunt resistor 36 and the known resistance value of the shunt resistor 36. The actual HF current ($I_{HF,actual}$) resulting from the high-frequency voltage ($U_{HF}$) or a measure for the resulting actual HF current ($I_{HF,actual}$) is present in any case at the output of the actual HF current value determining device 46.

The actual HF current ($I_{HF,actual}$) is compared by means of a comparator 48 with an HF current ($I_{HF,nom}$) that is expected as a result of the high-frequency voltage ($U_{HF}$). The expected (nominal) HF current ($I_{HF,nom}$) or a measure for the expected HF current ($I_{HF,nom}$) is provided by means of a nominal HF current value determining device 50. As an input signal, this device processes the switching state of the switch 22 of the control circuit 20, said state being fed to the monitoring circuit 40 at the first input 42. The functionality of the nominal HF current value determining device 50 can be implemented, for example, in the form of a table which comprises, in a first table element, a measure for the expected HF current ($I_{HF,nom1}$) for a first setting of the switch 22 and, in a second table element, a measure for the expected HF current ($I_{HF,nom2}$) for a second setting of the switch 22. Depending on the setting of the switch 22 fed to the first input 42, the nominal HF current value determining device 50 accordingly outputs the HF current ($I_{HF,nom}$=[$I_{HF,nom1}$, $I_{HF,nom2}$]) expected for the respective switch setting or a measure for the HF current ($I_{HF,nom}$=[$I_{HF,nom1}$, $I_{HF,nom2}$]) expected and forwards it in each case to the comparator 48. The comparator 48 performs the actual comparison between the expected HF current ($I_{HF,nom}$) and the actual HF current ($I_{HF,actual}$) resulting from the high-frequency voltage ($U_{HF}$).

The monitoring circuit 40 and the comparator 48 incorporated therein are accordingly an example of means of comparing the resulting HF current ($I_{HF,actual}$) with the HF current ($I_{HF,nom}$) expected from the application of the HF voltage ($U_{HF}$) to the power semiconductor switch 10 depending on the switching state of the power semiconductor switch 10.

If the comparator 48 detects parity or parity within a predefined or predefinable tolerance range, the comparator 48 outputs an OK signal at its output serving as output 52 of the monitoring circuit 40. In the event of no parity or insufficient parity of the two currents or current values compared by means of the comparator 48, the comparator 48 accordingly outputs a fault signal. Possibilities for an OK signal and a fault signal are, for example, a first defined signal level and a second defined signal level, so that the signal produced at the output 52 of the monitoring circuit 40 can be processed as a binary signal and the status of the monitored power semiconductor switch 10 indicated.

Figure 6:
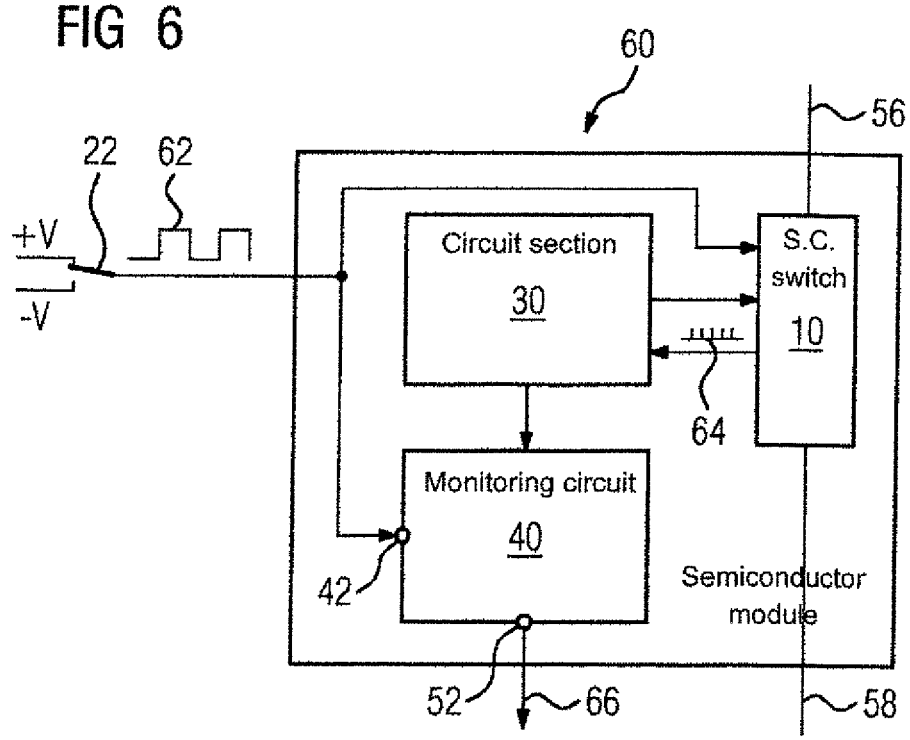
FIG. 6 shows a semiconductor module comprising a power semiconductor switch, a circuit section according to FIG. 4 and a monitoring circuit according to FIG. 5.

The monitoring circuit 40 can be implemented and operate on an analog or digital basis. The advantage of the proposed solution is that the operation of the power semiconductor switch 10 is monitored without involving the respective power circuit 56, 58 (FIG. 6). The monitoring circuit 40 can be incorporated together with the circuit section 30 in an "intelligent" semiconductor module 60, as shown in schematically simplified form in FIG. 6.

FIG. 6 shows a schematically simplified block diagram of a semiconductor module 60 operating according to the approach described here. The semiconductor module 60 is accordingly an example of a device for monitoring a power semiconductor switch 10, said device comprising, in particular in integrated form, all the hitherto described functional units. The semiconductor module 60 accordingly comprises at least the respective power semiconductor switch 10, possibly the power semiconductor switch 10 and the reverse diode 16, the circuit section 30 explained the reference to FIG. 4 and the monitoring circuit 40 explained with reference to FIG. 5. Such a semiconductor module 60 can be controlled by means of a switch 22 or the like. A resulting triggering signal 62 is fed to the power semiconductor switch 10 and the monitoring circuit 40. The power semiconductor switch 10 is also triggered by means of the circuit section 30 and the high-frequency voltage ($U_{HF}$) generated there using an HF signal 64 having a frequency above the switching threshold of the power semiconductor switch 10 (arrow pointing horizontally to the right from the circuit section 30 to the power semiconductor switch 10). An HF current ($I_{HF}$) flowing, which is dependent on the input capacitance of the power semiconductor switch 10, is detected by means of the circuit section 30, e.g. by means of the shunt resistor 36 there (arrow pointing horizontally to the left from the power semiconductor switch 10 to the circuit section 30) and forwarded to the monitoring circuit 40 (arrow pointing vertically downward from the circuit section 30 to the monitoring circuit 40). The triggering signal 62 is applied to the power semiconductor switch 10 and also at the same time to the monitoring circuit 40. Depending on the status of the triggering signal 62, this results in a status-dependent expected HF current or a status-dependent measure for an expected HF current within the monitoring circuit 40. This is compared by means of the monitoring circuit 40 with the actual HF current received from the circuit section 30 or the measure received from the circuit section 30 for the actual HF current. Present at the output 52 of the monitoring circuit 40 and therefore at the coinciding output of the semiconductor module 60 is a power semiconductor status signal 66 dependent on the result of the comparison 66, which signal can be evaluated for monitoring the power semiconductor switch 10 and is evaluated during operation. The comparator 48 incorporated in the monitoring circuit 40 is accordingly an example of means of generating a power semiconductor status signal 66 depending on the result of the comparison of the actual and expected HF current.

The respective power circuit 56, 58 is connected to the drain and source terminal or to the collector and emitter terminal of the respective power semiconductor switch 10. The power semiconductor status signal 66 that can be tapped off at the output 52 of the monitoring circuit 40 of such a semiconductor module 60 indicates the operability of the respective power semiconductor switch 10. As long as a signal is present there which indicates parity or sufficient parity of the expected and actual HF current, the power semiconductor switch 10 incorporated in the semiconductor module 60 can be deemed to be certified as safe.

Figure 7:
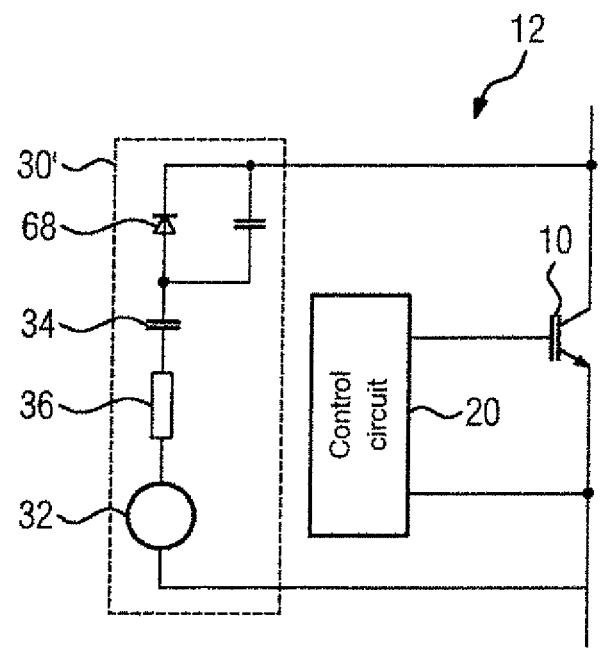
FIG. 7 shows a circuit section that could be used in addition or alternatively to the circuit section in FIG. 6 for triggering the power semiconductor switch to test the operability thereof.

In order to also detect the capacitance between drain and source or collector and emitter in addition or alternatively to the gate capacitance of the power semiconductor switch 10, the HF voltage can also be applied there. For this purpose FIG. 7 shows a corresponding circuit section 30'. This comprises a decoupling diode 68 and capacitance connected in parallel with the decoupling diode 68 (the control circuit 20 according to FIG. 3 is shown only as a functional block in FIG. 7). The functionality implemented by means of the circuit section 30' can also be regarded as a decoupling circuit. The capacitances comprised thereby must not be significantly below the power semiconductor switch capacitance to be measured, so that sufficient measurement accuracy can be achieved.

Although the invention has been illustrated and described in detail by advantageous embodiments, the invention is not limited by the examples disclosed and variations for other components having capacitive behavior may be inferred therefrom by a person skilled in the art without departing from the scope of protection sought for the invention. For example, power semiconductors in the form of so-called JFETs can also be tested using the approach presented here.

Individual salient aspects of the description submitted here may be briefly summarized as follows:

Specified are a device for monitoring a power semiconductor switch 10, wherein the device has means 30 of applying to the power semiconductor switch 10 an HF voltage ($U_{HF}$) having a frequency above the switching frequency of the power semiconductor switch 10, means 36 of detecting an HF current ($I_{HF,actual}$) resulting from the application of the HF voltage ($U_{HF}$) to the power semiconductor switch 10, means (40, 48) of comparing the resulting HF current ($I_{HF,actual}$) with an HF current ($I_{HF,nom}$) expected as a result of the application of the HF voltage ($U_{HF}$) to the power semiconductor switch 10 according to the switching state of the power semiconductor switch 10, and means 48 of generating a power semiconductor status signal 66 depending on the result of the comparison, as well as a corresponding method for monitoring a power semiconductor switch 10.

The invention claimed is:

1. A device for monitoring a power semiconductor switch, comprising:
   a circuit section applying to the power semiconductor switch an HF voltage having a frequency above a switching threshold of the power semiconductor switch, wherein the circuit section comprises a HF source and a filter network suitable for frequencies being at least higher than 10 MHz, a shunt resistor detecting an actual HF current resulting from application of the HF voltage to the power semiconductor switch, a monitoring circuit comparing the actual HF current with an expected HF current that depends on a switching state of the power semiconductor switch when the HF voltage is applied to the power semiconductor switch, said monitoring circuit comprising a first determining device determining an actual HF current value, a second determining device determining a nominal HF current value and the comparator, said first determining device comprising a first and a second memory location, with the first memory location storing a measure for the HF current expected for a first switching state of the power semiconductor switch, and with the second memory location storing a measure for the HF current expected for a second switching state of the power semiconductor switch, wherein the first or the second memory location are selected according to a triggering signal supplied to the power semiconductor switch, and a comparator generating a power semiconductor status signal depending on a result of the comparison, said comparator detecting a parity, or a parity within a predefined or a predefinable tolerance range and thereby outputting an OK signal at the output circuit when there is parity between the actual and the nominal HF current value, and said comparator thereby outputting a fault signal at the output circuit when there is no parity between the actual and the nominal HF current value, wherein the OK signal and the fault signal are respectively defined by a first defined signal level and a second defined signal, so that the produced signal at the output circuit is processed as a binary signal by the processor.

2. The device of claim 1, wherein the comparator is configured to generate a power semiconductor status signal depending on the result of the comparison.

3. A method for monitoring a power semiconductor switch, comprising:

applying to the power semiconductor switch an HF voltage having a frequency above a switching threshold of the power semiconductor switch, detecting an actual HF current and an expected HF current resulting from the application of the HF voltage to the power semiconductor switch with a first determining device including a first and a second memory location with the first memory location storing a measure for a HF current expected for a first switching state of the power semiconductor switch, and with the second memory location storing a measure for the HF current expected for a second switching state of the power semiconductor switch, wherein the first or the second memory location are selected according to a triggering signal supplied to the power semiconductor switch, comparing the actual HF current with the expected HF current that depends on the first and second switching state of the power semiconductor switch when the HF voltage is applied to the power semiconductor switch, and generating a power semiconductor status signal depending on a result of the comparison by a comparator detecting a parity, or a parity within a predefined or a predefinable tolerance range and thereby outputting an OK signal at the output circuit when there is parity between the actual and the nominal HF current value, and said comparator thereby outputting a fault signal at the output circuit when there is no parity between the actual and the nominal HF current value, wherein the OK signal and the fault signal are respectively defined by a first defined signal level and a second defined signal, so that the produced signal at the output circuit is processed as a binary signal by the processor, wherein a circuit section comprises a HF source and a filter network suitable for frequencies being at least higher than 10 MHz.

4. The method of claim 3, wherein the HF voltage is applied to the power semiconductor switch by a circuit section comprising an HF voltage source and a decoupling capacitor connected in series.

5. The method of claim 3, wherein the actual HF current is compared with the expected HF current by a monitoring circuit comprising a first determining device determining an actual HF current value, a second determining device determining a nominal HF current value and a comparator.

6. The method of claim 3, further comprising:

storing in a first memory location a measure for the HF current expected for a first switching state of the power semiconductor switch, and storing in a second memory location a measure for the HF current expected for a second switching state of the power semiconductor switch, with the first or the second memory location being selected according to a triggering signal supplied to the power semiconductor switch.

7. A semiconductor module comprising a device for monitoring a power semiconductor switch, wherein the device comprises:

a circuit section applying to the power semiconductor switch an HF voltage having a frequency above a switching threshold of the power semiconductor switch, wherein the circuit section comprises a HF source and a filter network suitable for frequencies being at least higher than 10 MHz, a shunt resistor detecting an actual HF current resulting from application of the HF voltage to the power semiconductor switch, a monitoring circuit comparing the actual HF current with an expected HF current that depends on a switching state of the power semiconductor switch when the HF voltage is applied to the power semiconductor switch, said monitoring circuit comprising a first determining device determining an actual HF current value, a second determining device determining a nominal HF current value and the comparator, said first determining device comprising a first and a second memory location, with the first memory location storing a measure for the HF current expected for a first switching state of the power semiconductor switch, and with the second memory location storing a measure for the HF current expected for a second switching state of the power semiconductor switch, wherein the first or the second memory location are selected according to a triggering signal supplied to the power semiconductor switch; and a comparator generating a power semiconductor status signal depending on a result of the comparison, said comparator detecting a parity, or a parity within a predefined or a predefinable tolerance range and thereby outputting an OK signal at the output circuit when there is parity between the actual and the nominal HF current value, and said comparator thereby outputting a fault signal at the output circuit when there is no parity between the actual and the nominal HF current value, wherein the OK signal and the fault signal are respectively defined by a first defined signal level and a second defined signal, so that the produced signal at the output circuit is processed as a binary signal by the processor.

* * * * *